(12) United States Patent
Siddique et al.

(10) Patent No.: US 11,733,285 B2
(45) Date of Patent: Aug. 22, 2023

(54) TOUCH SAFE DC POWERING FOR REMOTE LOADS

(71) Applicant: ALPHA TECHNOLOGIES LTD., Burnaby (CA)

(72) Inventors: Rifat Siddique, Burnaby (CA); Andres Bianchi, Burnaby (CA); Peter Ksiazek, Burnaby (CA); Glenn Lumanog, Surrey (CA)

(73) Assignee: Alpha Technologies Ltd., British Columbia (CA)

( * ) Notice: Subject to any disclaimer, the term of this patent is extended or adjusted under 35 U.S.C. 154(b) by 209 days.

(21) Appl. No.: 16/894,241

(22) Filed: Jun. 5, 2020

(65) Prior Publication Data

US 2021/0382102 A1 Dec. 9, 2021

(51) Int. Cl.
| | |
|---|---|
| *G01R 31/08* | (2020.01) |
| *G01R 31/28* | (2006.01) |
| *G01R 31/52* | (2020.01) |
| *H02H 3/44* | (2006.01) |
| *H02H 7/12* | (2006.01) |
| *H02M 1/00* | (2006.01) |

(52) U.S. Cl.
CPC ......... *G01R 31/085* (2013.01); *G01R 31/088* (2013.01); *G01R 31/2879* (2013.01); *G01R 31/52* (2020.01); *H02H 3/445* (2013.01); *H02H 7/1213* (2013.01); *H02M 1/0009* (2021.05)

(58) Field of Classification Search
CPC .... G01R 31/085; G01R 31/52; G01R 31/088; G01R 31/2879
See application file for complete search history.

(56) References Cited

U.S. PATENT DOCUMENTS

| | | | | |
|---|---|---|---|---|
| 2,244,086 A | * | 6/1941 | Scott, Jr. | ................ H02H 3/066 361/59 |
| 5,570,028 A | | 10/1996 | Sperlazzo et al. | |
| 9,705,337 B2 | * | 7/2017 | Owen | ........................ H02J 3/38 |
| 2006/0267563 A1 | * | 11/2006 | Belson | .............. H02M 3/33515 323/266 |
| 2011/0085273 A1 | * | 4/2011 | Bengtsson | ........... H02H 11/005 361/65 |
| 2011/0175565 A1 | * | 7/2011 | Lee | ........................... H02J 3/32 320/101 |
| 2012/0026633 A1 | * | 2/2012 | Babb | ....................... H02H 3/24 361/56 |
| 2012/0126785 A1 | | 5/2012 | Paik et al. | |

(Continued)

OTHER PUBLICATIONS

Meghwani, A., et al., "A Non-Unit Protection Scheme for DC Microgrid Based on Local Measurements", IEEE Transactions of Power Delivery, vol. 32, No. 1, Feb. 2017.

*Primary Examiner* — Bryan Bui
(74) *Attorney, Agent, or Firm* — Volpe Koenig

(57) ABSTRACT

In a line to line fault detection and protection system, a source end power supply supplies power to a remote load over a transmission line and monitors the dynamic behavior of a transmission line power characteristic. If that dynamic behavior is outside a constraint that is actively imposed on the transmission line dynamic behavior by a load end power conditioning system, a possible line to line fault is recognized. The preferred power characteristic is current and the preferred constraint is a maximum rate of change of current drawn from the transmission line by the load end power conditioning system.

7 Claims, 7 Drawing Sheets

(56) References Cited

U.S. PATENT DOCUMENTS

| | | | |
|---|---|---|---|
| 2016/0352091 A1* | 12/2016 | Qi | H02H 3/38 |
| 2017/0110969 A1* | 4/2017 | Zhou | H02J 3/381 |
| 2017/0229886 A1 | 8/2017 | Eaves | |
| 2018/0106849 A1* | 4/2018 | Burek | H02H 7/268 |

* cited by examiner

TOUCH SAFE DC POWERING FOR REMOTE LOADS

FIELD OF THE INVENTION

This invention relates to power transmission. In particular, this invention relates to fault protection in the supply of power to remote loads, and is particularly suited for communications networks.

BACKGROUND OF THE INVENTION

The transmission of remote line DC power for telecommunications is subject to a variety of standards depending on the type of transmission system involved. For example, in RFT-V systems, the power per circuit is generally limited to 100 W if the voltage is greater than ±150V DC, unless additional protections are in place. However, with the increasing use of higher power radios for small cell networks, that power limit tends to prevent cost effective and rapid deployment and solutions are needed that allow higher power transmission.

One of the challenges in supplying remote loads at higher power levels is to ensure the safety of installers and of the general public. Fault protection standards cover a variety of fault types, including line to line faults.

Ground fault protection has long been used to ensure the safety of both persons who may come into contact with one of the power line conductors and the equipment involved. Line to line (tip to ring) faults involve the measurement of different parameters of the line powering circuit and different protection strategies as compared to ground faults. Traditionally, the detection of tip to ring faults was not considered critical as the voltages and available power in each circuit were low enough to prevent serious injury or death. With the advent of high DC voltage transmission at higher powers, the detection of line to line faults has become more important. One conventional approach is to rely on digital power techniques in which the power is cyclically turned off and the presence of any line to line current in the OFF period is taken to indicate a line to line fault. When a line to line fault is detected, switches to the transmission line are turned off. However, it has been observed that the switches are vulnerable to damage in the event of surges. In addition such an approach involves potentially unnecessary fluctuations in the transmission line voltage Conventional approaches for detecting source end transmission line features that may be characteristic of a fault include the discrimination of faults in microgrids by reference to the fault current and its first and second order derivatives. These approaches include determining thresholds that characterize faults. However, the flow through of load transients have the potential of inducing current changes on the transmission line that can mimic fault conditions.

It is therefore an object of this invention to provide a remote load power system adapted to reliably detect and protect against line to line faults.

It is a further object of this invention to allow the detection of fault conditions which could result in harm and to shut down the power circuit, thereby preventing injury to persons and property while enabling higher power transmission to remote loads.

These and other objects will be better understood by reference to this application as a whole. Not all of the objects are necessarily met by all embodiments of the invention described below or by the invention defined by each of the claims.

SUMMARY OF THE INVENTION

A power supply converts locally available power to a high DC voltage (for example ±190V DC) to be supplied to a transmission line, which may be kilometers in length. The power supply to the transmission line is sometimes referred to as an "upconverter" in its typical applications. The load end comprises what is traditionally known as a "downconverter" as the high DC voltage used for transmission is converted to the lower DC voltages at which the terminal equipment functions.

According to the preferred embodiment of the invention, the current on the line is monitored by the source-side power supply. The remote end of the transmission line is connected to a power conditioning system which serves two purposes. First, it converts the input voltage to a regulated supply voltage for powering a load; and, second, it controls the characteristic of the load as seen by the transmission line, such that the load behaves differently than a fault condition. The source-side power supply constantly monitors the transmission line current and reduces (either partially or to zero) its own high voltage output if the current on the line does not match the characteristic allowed by the remote power conditioning system. That approach avoids the use of switches on the transmission line. If a potential line to line fault is detected, the source power supply may implement a verification and restart protocol.

According to the preferred embodiment, the remote power conditioning system controls the rate of change of current on the transmission line such that it is less than the rate of change of any expected line to line fault currents which may occur. If the source power supply detects a rate of change of current in the transmission line that exceeds that allowed by the power conditioning system, the source-end power supply disables its high voltage output to the line.

In an embodiment, upon detecting a potential fault, the line is supplied with a low voltage to enable the verification of a fault condition. Preferably, the low voltage value during verification is configured such that the current profile through the human body during the entire event is mapped inside the DC2 zone in the IEC 60479 standard or by reference to another suitable standard. The remote power conditioning system has an input low-voltage cutoff which prevents power being drawn when the voltage on the transmission line is below some nominal threshold. Because the remote power conditioning system will not draw any current from the transmission line at this voltage, if appreciable current is detected, the possibility of a continued fault is confirmed and the low voltage is maintained on the line, or the voltage to the line is brought to zero. Preferably, a line to line fault verification and re-establishment protocol is followed according to which the voltage is first brought down to a safe low voltage, current between the two transmission line conductors is evaluated and if present the line to line fault is considered confirmed. Once current is no longer detected or is no longer detected within an acceptable threshold, the fault considered cleared and normal high voltage is re-established on the transmission line. If the fault continues to be confirmed for a predetermined period of time, the voltage output to the transmission line may be brought to zero.

According to the preferred embodiment, the power conditioning system includes a line power converter supplying an energy storage unit comprising one or more capacitors. One or more DC-DC converters draw on the capacitors to feed the loads such that the capacitors effectively buffer the loads. The line power converter increases or decreases the supply to the energy storage capacitors whenever the voltage across them varies from their nominal value, for example as a result of load transients. However, that change in supply from the line power converter is ramp or slope limited to ensure that the current drawn from the line does not exceed a threshold rate of change used to discriminate normal line current fluctuations from potential line to line faults.

The capacitors can also supply power to the load during transmission line interruptions for very short periods of time in the order of a few to even tens of milliseconds depending on the size of the capacitors.

The invention can be generalized from controlling and monitoring a current and a rate of change of line current as in the preferred embodiment to controlling other dynamic behaviors of the load or of the load end power conditioning system and monitoring, from the source end, the transmission line for behavior that exceeds the predetermined parameters imposed on those characteristics at the load end.

Viewed as a system, in one aspect the invention is a system for providing DC power to a remote load over a transmission line. The system comprises a source-end power supply supplying DC power to the transmission line, and a power conditioning system for receiving power from the transmission line and supplying power to the load, but wherein the power conditioning system is controlled to limit a rate of change of current drawn from the transmission line to a maximum rate of change. The source-end power supply is correspondingly configured to reduce its supply of power to the transmission line upon detecting that a rate of change of current drawn by the transmission line is in excess of the maximum rate of change constraint that is applied in the power conditioning system at the load end.

At a more general level, the system limits a dynamic behavior of the load as seen by the transmission line, by means of a load end control system constraining that dynamic behavior to be within certain parameters that have been predetermined by the load end control system. In the preferred embodiment, that dynamic behavior is a rate of change of current and the parameters are a maximum rate of change of current. A source end control system reduces the supply of power from a source power supply to the transmission line upon detecting that a dynamic behavior of the transmission line is outside the parameters that have been predetermined by said load end control system. The load end of the transmission line may comprise a power conditioning system for receiving power from the transmission line and delivering it to the load, the load end control system limiting a rate of change of current drawn by the power conditioning system from the transmission line. The system may further comprise a load end power supply for receiving power from the transmission line and delivering power to the load, the load end control system limiting the rate of change of current drawn by the load end power supply from the transmission line.

The system may further comprise an energy storage unit as a buffer between the load end power supply and the load. The system may control the output of the load end power supply to target a desired power supplied to the load, the control system limiting the rate of change of current drawn by the load end power supply from the transmission line.

In a method aspect, the invention is a method for protecting against line to line faults in a power transmission line that delivers power to a remote load. The method involves reducing power delivered by a source end power supply to the transmission line if a dynamic behavior of a power characteristic (for example current, voltage or power) of the transmission line exceeds a predetermined parameter imposed on the characteristic by a load end power conditioning system supplying the remote load. The dynamic behavior may be a change in current and the predetermined parameter may be a maximum rate of change of current.

The step of reducing power delivered by a source end power supply may comprise reducing the power output of said source end power supply. More particularly it may comprise reducing a gain of a converter. That is in distinction to, for example, opening a switch between the converter and the transmission line.

In a line fault verification aspect, the step of reducing power delivered by a source end power supply to the transmission line may comprise reducing the power to a non-zero level and further comprising the steps of detecting whether there is current on the transmission line at the non-zero level of power; if so, continuing or repeating the step of detecting; and, if there is no current on the transmission line at the non-zero level of power, increase the power supplied by the source end power supply to the transmission line. The step of continuing or repeating preferably terminates after a predetermined elapsed time.

From the point of view of the operational aspects of the load end of a transmission line, the invention is a power conditioning system for a load supplied by a DC power transmission line comprising input terminals for receiving power from the transmission line, output terminals for supplying power to the load and a control system limiting the rate of change of current drawn by the power conditioning system from the transmission line to a maximum rate of change.

The power conditioning system may comprise an energy storage subsystem, which in turn preferably comprises one or more capacitors. The power conditioning system may include a power converter.

In another method aspect, the invention is a method for conditioning power received by a DC power transmission line for a load comprising receiving DC power from the transmission line, a power conditioning system conditioning the DC power received from the transmission line, presenting conditioned DC power to the load and limiting the rate of change of current drawn from the transmission line by the power conditioning system to a maximum rate of change.

In a control system aspect, the invention is a control system for use in a power transmission system delivering power to at least one remote load over a transmission line, the control system being effective to limit a rate of change of current drawn by the load from the transmission line to a maximum rate of change determined by the control system. The control system may comprise a load end power converter for receiving power from the line and delivering power to the load, wherein the control system limits the rate of change of current by controlling the operation of the power converter. An energy storage unit may be used as a buffer between the power converter and the load. Preferable, the control system controls the output of the converter to target a desired power supplied to the load but wherein the control system limits the rate of change of current drawn by the converter from the transmission line.

In another aspect, the values of circuit elements and circuit features of the power conditioning system may be selected such that the overall response of the power conditioning system inherently imposes a predetermined constraint on a dynamic behavior parameter of the power drawn from the transmission line. For example, the circuit elements and features may be designed and selected such that the overall response of the power conditioning system inherently limits the rate of change of current drawn from the transmission line to a predetermined maximum. The source end power supply then operates to sense whether the rate of change of current on the transmission line exceeds that predetermined maximum. If it does, a potential line to line fault is recognized and appropriate action is taken by the source end power supply.

The foregoing may cover only some of the aspects of the invention. Other and sometimes more particular aspects of the invention will be appreciated by reference to the following description of at least one preferred mode for carrying out the invention in terms of one or more examples. The following mode(s) for carrying out the invention are not a definition of the invention itself, but are only example(s) that embody the inventive features of the invention.

BRIEF DESCRIPTION OF THE DRAWINGS

At least one mode for carrying out the invention in terms of one or more examples will be described by reference to the drawings thereof in which.

DETAILED DESCRIPTION OF THE PREFERRED EMBODIMENTS AND OTHER EMBODIMENTS

Figure 1:
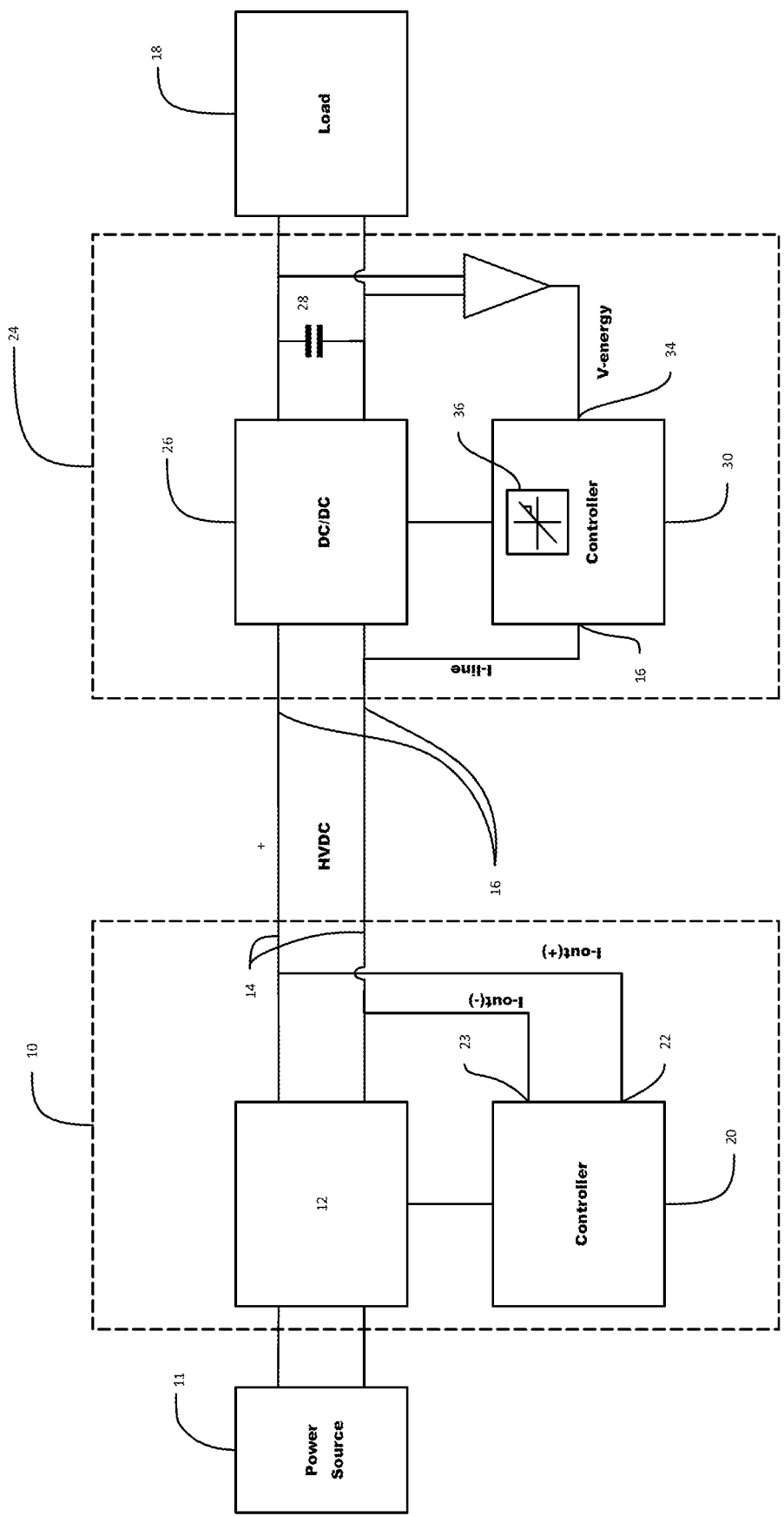
FIG. 1 is a schematic of a power transmission system according to the invention.

Referring to FIG. 1, a source-side power supply 10 is fed by an AC or DC power source 11, which may be AC mains, a DC power distribution system, an AC or DC uninterruptible power system, or alternative power sources such as solar, wind or other power. The power supply 10 includes a power converter 12 for supplying a high voltage DC output 14 to a transmission line 16 for powering a remote load 18. The transmission line 16 is in the order of kilometers in length. A remote power conditioning system 24 receives power from the transmission line 16 and delivers it to the load 18.

The power supply 10 includes a controller 20 that senses 22, 23 the current drawn from the transmission line 16 (or a parameter from which line current can be evaluated) and evaluates the rate of change of that current. If the rate of change exceeds a predetermined threshold shared by the power conditioning system 24, the controller 20 causes the converter 12 to discontinue supplying high voltage DC through the output 14 of the converter 12. For example, the converter may transition from supplying high voltage DC to supplying low voltage DC that is safe for persons or equipment causing a possible line to line fault. Such low voltage output may be maintained at least while a fault verification protocol is followed.

In an embodiment, the detection of the threshold rate of change of current may be implemented directly into the circuitry of the converter 12 rather than being digitally processed in a controller 20. Where implemented in a controller 20, the detection may use time domain analysis of di/dt, frequency domain analysis or use other domains or approaches.

The power conditioning system 24 receives incoming power from the transmission line 16 and outputs power at the proper voltage to supply the load 18. In this description and in the claims, the term "power conditioning system" means any system for receiving power and modifying it so as to be suitable for delivery to a load, whether by converters or otherwise. Such load may include passive or active loads, including other converters.

The power conditioning system 24 preferably comprises a DC-DC converter 26 that feeds an energy storage unit 28 that in turn feeds the load 18. The energy storage unit 28 may be one or more capacitors and the energy storage unit is persistently available to and connected to the load. The load for the power conditioning system 24 may be terminal equipment but it may also be viewed as including a plurality of DC-DC downconverters for reducing the voltage across the capacitors 28 to a voltage suitable to drive terminal equipment such as telecommunication radios. In other embodiments, the load may include types of other converters such as DC-AC converters or upconverters for powering particular loads.

A controller 30 senses 34 the voltage across the energy storage unit 28 and controls the DC-DC converter 26 to increase or decrease its output as necessary to maintain an optimal voltage across the energy storage unit 28 through load transients. In accordance with the principles of the invention, controller 30 includes a slope limiter function 36 that limits the rate of change of current drawn from the transmission line 16. Although the slope limiter function 36 is illustrated and described as part of a controller 30 that is separate from the converter 26, the slope limiting function may be integrated directly into the converter 26.

The effect of the slope limiter function 36 is to control the profile of the current drawn from the transmission line 16 by the power conditioning system 24. In particular, it controls the rate of change of that current to a predetermined maximum threshold. That threshold is selected to be below the rate of change seen during line to line faults. While a slope limiter is the preferred embodiment for slope control, other control techniques could be used, for example limiting the responsiveness or bandwidth of the converter control.

At the source end of the transmission line 16, if the controller 20 senses a rate of change of transmission line current that is less than the predetermined maximum threshold such change may be the result of normal variations in line current or permissible variations induced by the power conditioning system 24, including as a result of load transients. In such cases, the power supply 10 continues to operate normally. However, if the rate of change is detected to be above the threshold, such rate of change is not likely the result of normal operation of the power conditioning system 24 and the possibility of a line to line fault is recognized. The controller 20 then causes the converter 12 to reduce its output voltage as applied to the transmission line 16 to a safe level for any persons and equipment that may be causing line to line faults. In the preferred embodiment, the voltage is reduced by varying the gain of the converter 12.

Once the voltage on the transmission line 16 has been reduced to a safe voltage, a fault verification and clearance protocol may be followed to confirm that there does indeed appear to be a line to line fault, and to resume normal high voltage operation if not.

In an embodiment, reducing the gain of the converter may involve shutting off the converter. In such embodiment, no fault verification is conducted or fault verification may be conducted using an alternative low voltage supply.

In cases where the converter includes an output capacitor that may hold charge that would be applied to the transmission line, a shunt may be used to safely discharge the capacitor when reducing the gain of the converter or shutting the converter off. In an embodiment, a crowbar circuit may be provided consisting of a controllable switch 17, which may include a current limiting element in series (not shown), which is connected in parallel to the output capacitor of the source power converter. When a potential fault is detected the switch is activated which rapidly discharges the output capacitor of the source power converter to a safe level thus preventing the energy stored in the capacitor from being applied to the fault.

Figure 6:
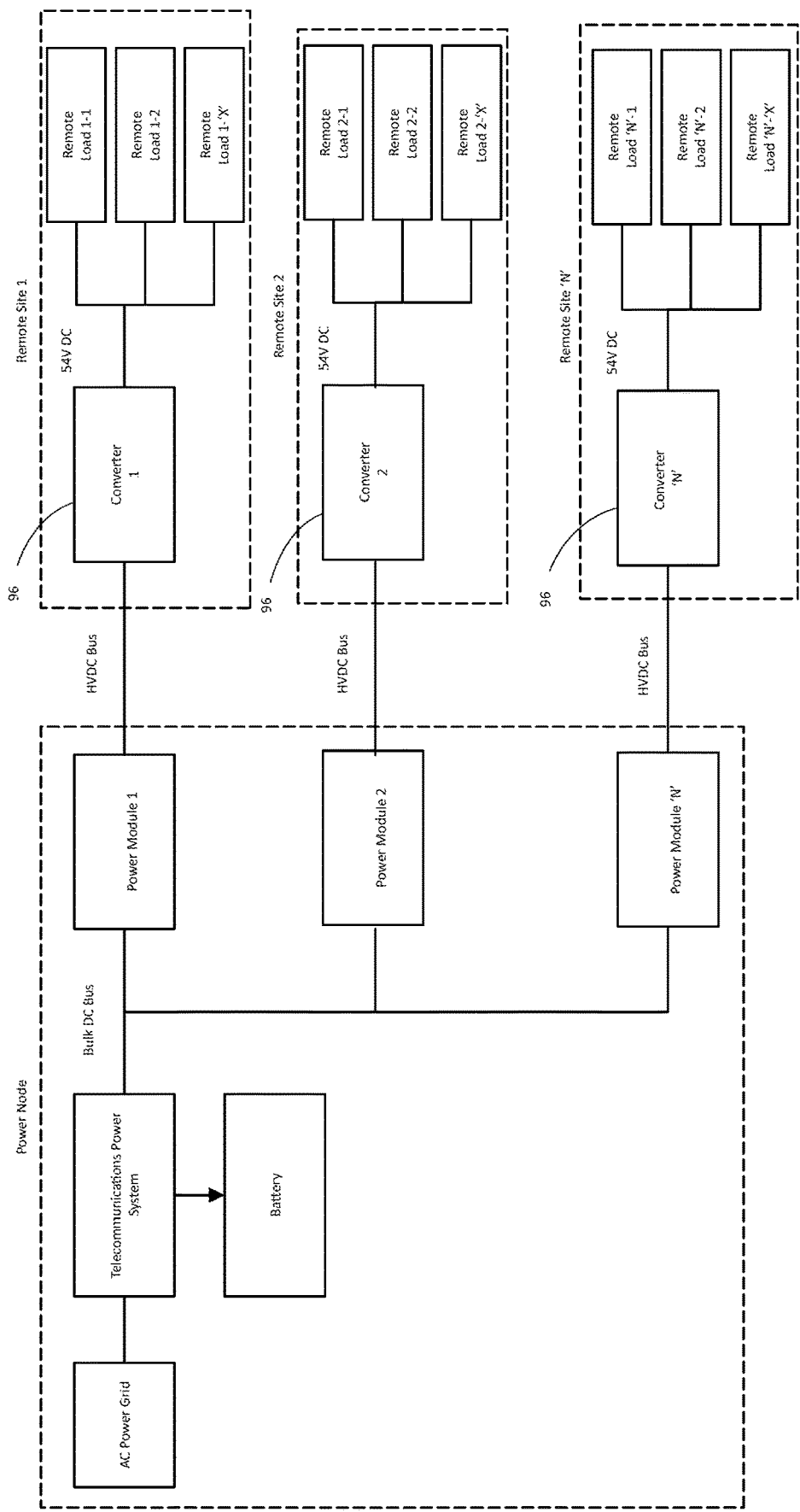

According to the preferred embodiment, each source-side power converter 12 is associated with a single transmission line 16 and a single remote power conditioning system 24 so as to provide a point to point power supply architecture rather than a common bus architecture. Referring to FIG. 6, a plurality of remote sites may be supplied using the system of the present invention. Each remote site is supplied through a dedicated high voltage DC (HVDC) transmission line or bus. For each dedicated HVDC line, a power module (which may include power supply 10 that is discussed in relation to FIG. 1) is provided at the source end of the line (in one or more power nodes) for sensing the dynamic behavior of the line current and for controlling the voltage that is output to the HVDC line. At the load end of each dedicated line, a converter module 96 (which may embody the power conditioning system 24 that is discussed in relation to FIG. 1) is provided to control the rate of change of line current that is drawn from the HVDC line at the respective remote site. The same converter module 96 may directly supply conditioned power to the remote loads 1-x, 2-x, . . . , N-x at the given remote site or may supply power to individual load converters associated with each terminal equipment.

Figure 2:
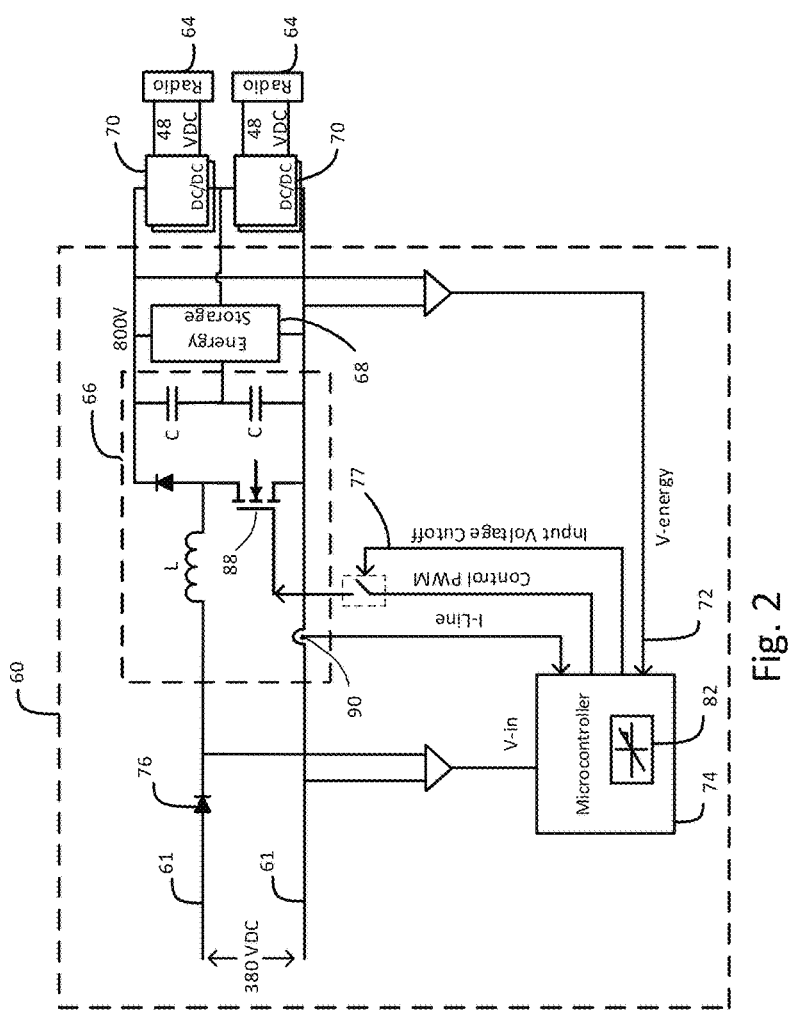
FIG. 2 is a schematic of a remote load power conditioning system according to the preferred embodiment.
Figure 4:
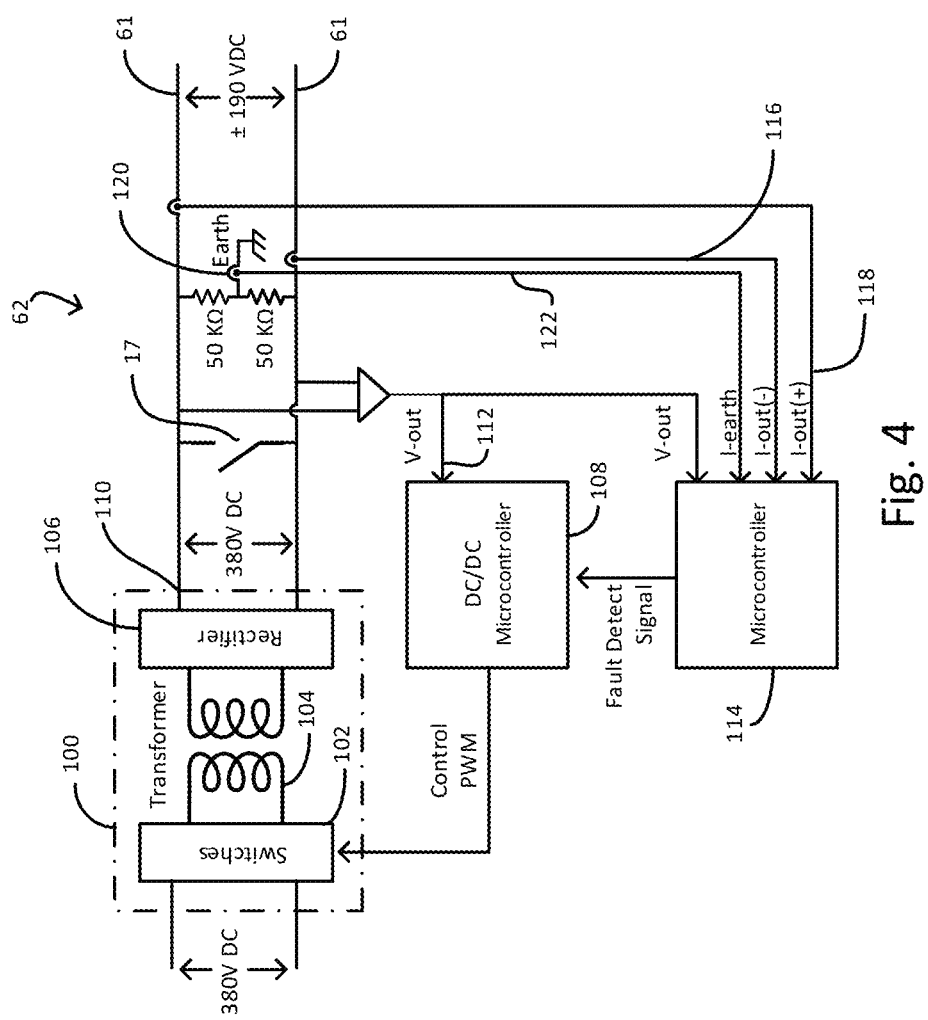
FIG. 4 is a schematic of the source-side power supply according to the preferred embodiment.

FIG. 2 is a schematic of the power conditioning system 60 of the preferred embodiment while FIG. 4 is a schematic of the power supply 62 according to the preferred embodiment.

In the preferred embodiment, an external power source supplies 380V DC to the input of the power supply 62. The power supply 62 supplies a transmission line 61 with ±190V DC. At the load end of the line, a power conditioning system 60 converts the line voltage to a plurality of 48V DC outputs to, for example, 450 W telecommunication radios 64.

The power conditioning system 60 comprises a boost converter 66 for boosting the voltage to 800V (according to the illustrated embodiment) as the nominal or target voltage for the energy storage unit 68. The relatively high 800V is effective for holding high energy in the energy storage unit 68, which is preferably one or more capacitors.

The energy storage unit 68 acts as a buffer between the output of the boost converter 66 and a plurality of DC-DC converters 70, each of which supplies 48V to a cellular radio 64. The presence of the energy storage unit 68 ensures that when a load is first connected, or during other load transients, the sudden ramp up of current to the load is drawn from the energy storage unit 68 rather than from the transmission line, allowing the converter 66 to more easily control the profile of the current drawn from the transmission line. The energy storage unit 68 is preferably, but not necessarily, capacitive and persistently connected to the load, or to converters that are connected to loads.

The size of the energy storage unit 68 is chosen as a function of the maximum load and of the maximum rate of change allowed by the boost converter 66 to recharge the energy storage unit 68 before the instantaneous energy storage voltage falls below the levels required for operation of the load or the converters connected to the loads. The energy storage unit 68 must be large enough to allow continuous powering of the radios 64 during a typical load transient even while the slope limiter is otherwise limiting the ability of the boost converter 66 to recharge the energy storage unit 68.

The voltage across the energy storage unit 68 is used as feedback 72 to a controller 74 that varies the duty cycle of the boost converter 66 to increase the converter output when the voltage across the energy storage unit 68 falls below its target value or to decrease the converter output when the voltage rises about a certain value.

A diode 76 at the input of the boost converter 66 protects against reverse power flow and reverse polarity connections. A low voltage cut-off 77 is provided to shut down the operation of the boost converter 66 in the event that the transmission line voltage input to the power conditioning system 60 is less than the voltage required to maintain normal converter operation. That would include when the power supply 62 has detected a fault condition and has reduced power to the transmission line to a low voltage while it verifies a fault.

The rate of change of current drawn from the transmission line 61 by the power conditioning system 60 is controlled to be below a predetermined threshold rate of change. This is accomplished by including a slope limiter 82 in the converter control algorithm in the microcontroller 74.

During load transients, there may be transients in the energy drawn by the load from the energy storage unit 68. As the energy storage unit is depleted, the converter reacts to replenish it without exceeding the threshold rate of change of current drawn from the transmission line. The controller 74 senses 72 the voltage across the energy storage unit 68. If the charge in the energy storage unit becomes low, notably as a result of load transients, that reduction in V-energy is sensed 72 causing the controller to vary the duty cycle of switch 88 to increase the output voltage of the controller 66. Similarly if the voltage across the energy storage unit 68 is sensed as being too high, the converter output is reduced. The slope limiter 82 limits the magnitude of the instantaneous increase in current by monitoring the rate of change induced for the controller through feedback from I-line.

Ramp/slope control of the current drawn by the converter 66 from the transmission line is achieved by reference to a current sensor 90.

Figure 3:
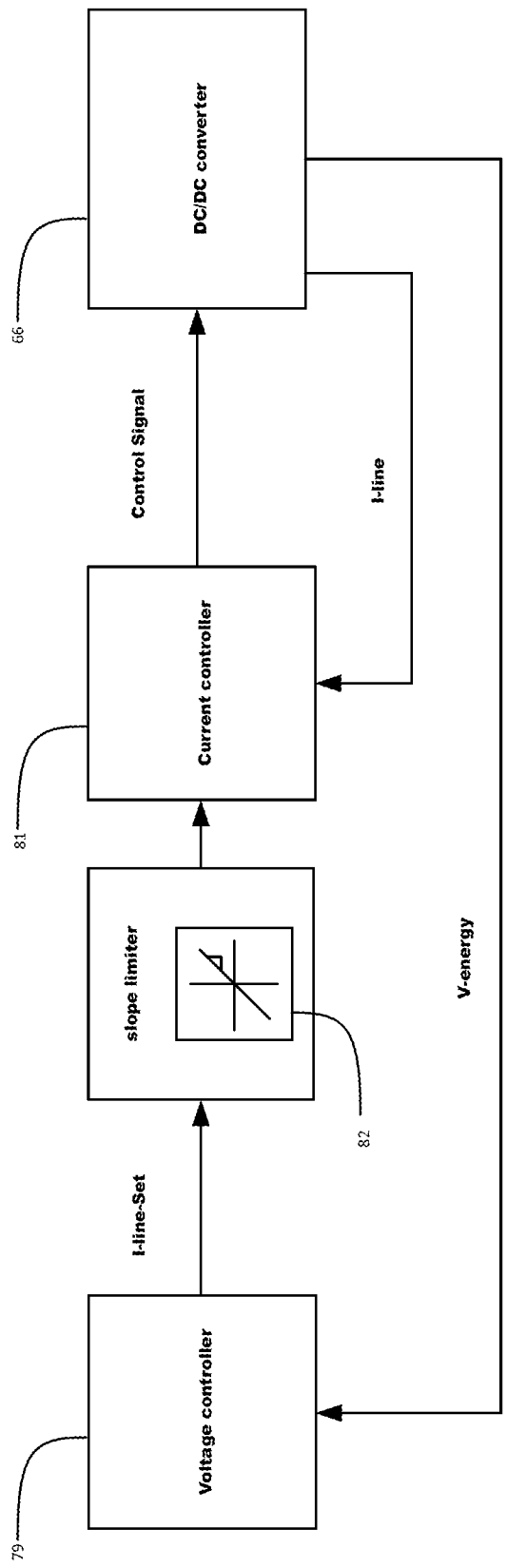
FIG. 3 is a control diagram for the power conditioning system.

FIG. 3 shows a control diagram according to the preferred embodiment. Most of the illustrated control functions are embodied in microcontroller 74 (FIG. 2). V-energy represents the output voltage of the DC/DC converter 66 whose output is in parallel with the energy storage unit 68. A Voltage controller function 79 determines the corresponding I-line-Set that should theoretically be applied as the input current for the converter 66 needed to keep the converter output at the nominal output voltage (e.g. 800V in the preferred embodiment). Slope limiter 82 prevents the implementation of a new set input current that would result in a transmission line rate of change over the predetermined threshold. I-line-Set as modified by the slope limiter 82 provides the new instantaneous current target input for the Current controller function 81. The latter is used in a feedback loop to control the current drawn into the DC/DC converter 66. If the current supplied to the converter is still not sufficient to maintain the desired voltage output, the control loop operates to re-adjust I-line-Set (subject to slope control) until the converter is drawing sufficient current to maintain the desired voltage across the energy storage unit. The controller works analogously when the voltage in the storage unit exceeds the voltage setpoint and the input current needs to be decreased.

Referring to FIG. 4, power supply 62 includes a converter 100 for converting the external input voltage (in this embodiment 380 V DC) to the transmission line voltage (in this case ±190V DC). If no effective voltage conversion takes place, as in the illustrated embodiment, the converter nonetheless serves to isolate the power distribution system from the external power source. The illustrated converter 100 is a switch mode converter that includes switches 102, a transformer 104 and a rectifier 106. Operation of the converter 100 is through microcontroller 108 control of the switches 102 to maintain the output 110 of the converter at the desired level by monitoring 112 the voltage at the output, as is known. Other methods of control of the converter, such as analog or the use of a control IC, may be contemplated.

A dedicated controller 114 acts to sense the current profile on each of the positive and negative conductors of the transmission line 61 (I-out(−) 116 and I-out(+) 118) and assesses whether the rate of change of either conductor current exceeds the rate of change threshold used to limit the current drawn from the transmission line by the power conditioning system 60. If it does exceed the rate of change threshold, a fault is determined and the voltage supplied to the transmission line is reduced to a low voltage, for example 60V DC.

The reduction of voltage presented to the transmission line 61 is accomplished by controlling the operation of the converter 100 to reduce the converter's voltage output, for example by appropriate control of the duty cycle or frequency of switches 102. Such approach avoids the use of switches in series with the high voltage transmission line 61.

Once a low voltage is being applied to the transmission line, a fault verification protocol is engaged. Due to the low voltage cutoff 77 in the power conditioning system 60, no current is drawn from the transmission line during the low voltage condition. If line to line current is detected by the power supply 62 during the low voltage condition, then a line to line fault is considered to have been confirmed. The presence of a line to line fault is continually or periodically checked in this manner until the fault is cleared or until a safety time out shut down is performed. If no line to line current is detected during the low voltage condition, then the line to line fault is considered cleared and high voltage operation of the converter is resumed and power output is restored to the line. Upon detection of a suitable high voltage by the power conditioning system 60, normal operation of the power conditioning system resumes.

Figure 5A:
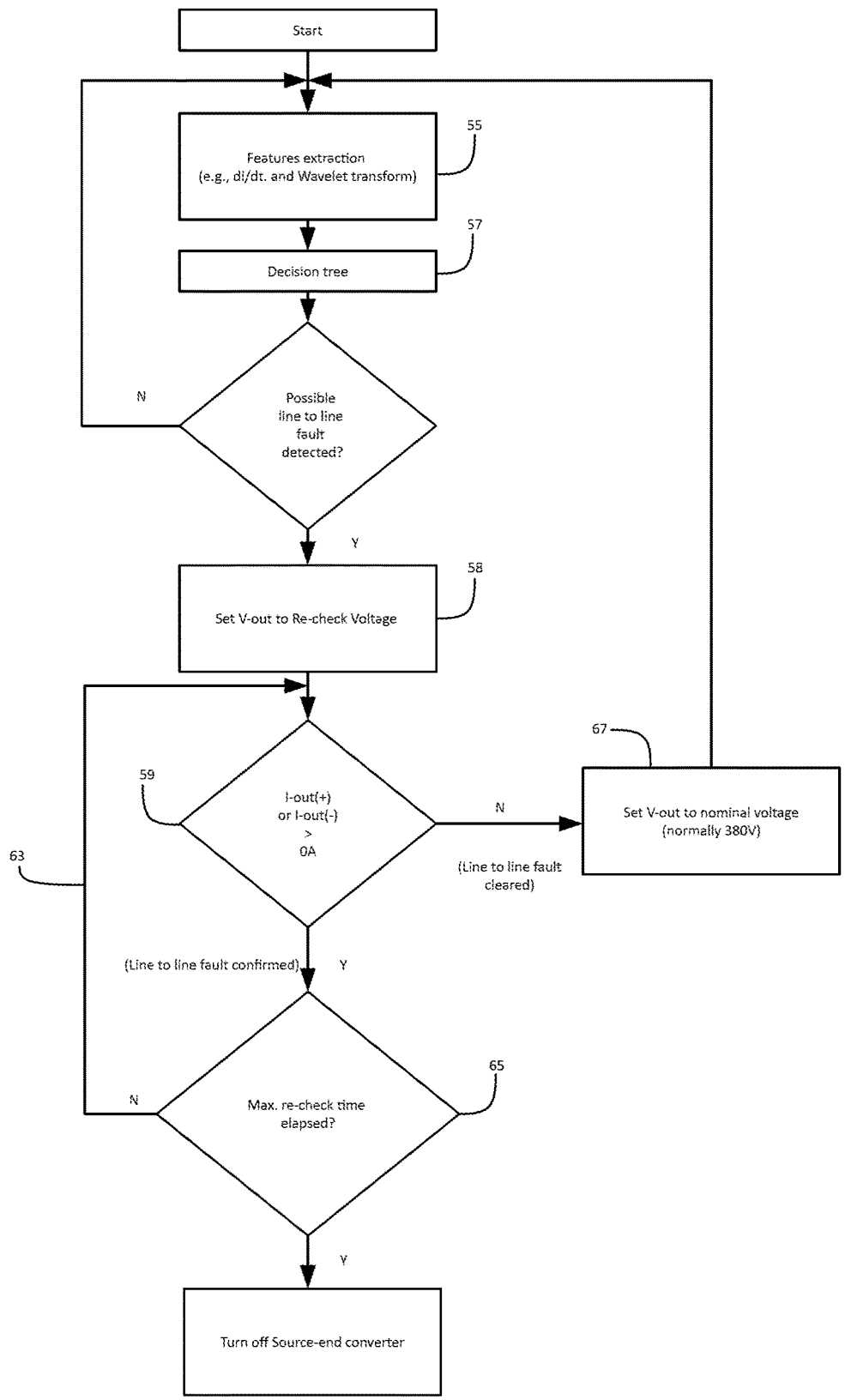
FIG. 5A is a control flowchart for the power supply for the generalized case of feature extraction from the transmission line variables.

FIG. 5A is a flowchart for the control of the source end power supply for the generalized case of features extraction of the transmission line variables. Feature extraction 55 is performed on the transmission line variables, such by assessing a rate of change of current in the time domain or the application of a wavelet transform or other feature extraction techniques. A decision tree 57 determines whether the extracted features fall within a class of possible line fault conditions. If so, V-out is reduced 58 to a voltage ("Re-check Voltage") suitable for safely confirming a line fault. That confirmation is conducted by assessing 59 the presence of any current on the transmission line (I-out). If current is present, a line to line fault is confirmed and is monitored 63 for correction of the fault condition by the absence of transmission line current. At 65 the elapsed time for the monitoring 63 is checked for a maximum permissible re-check time. If the time is exceeded, the source end converter is turned off. The monitoring may also be by discrete checks with a predetermined number of checks. If current is not detected during the Re-check Voltage state, then the line to line fault is considered cleared and full voltage operation is resumed 67.

Figure 5B:
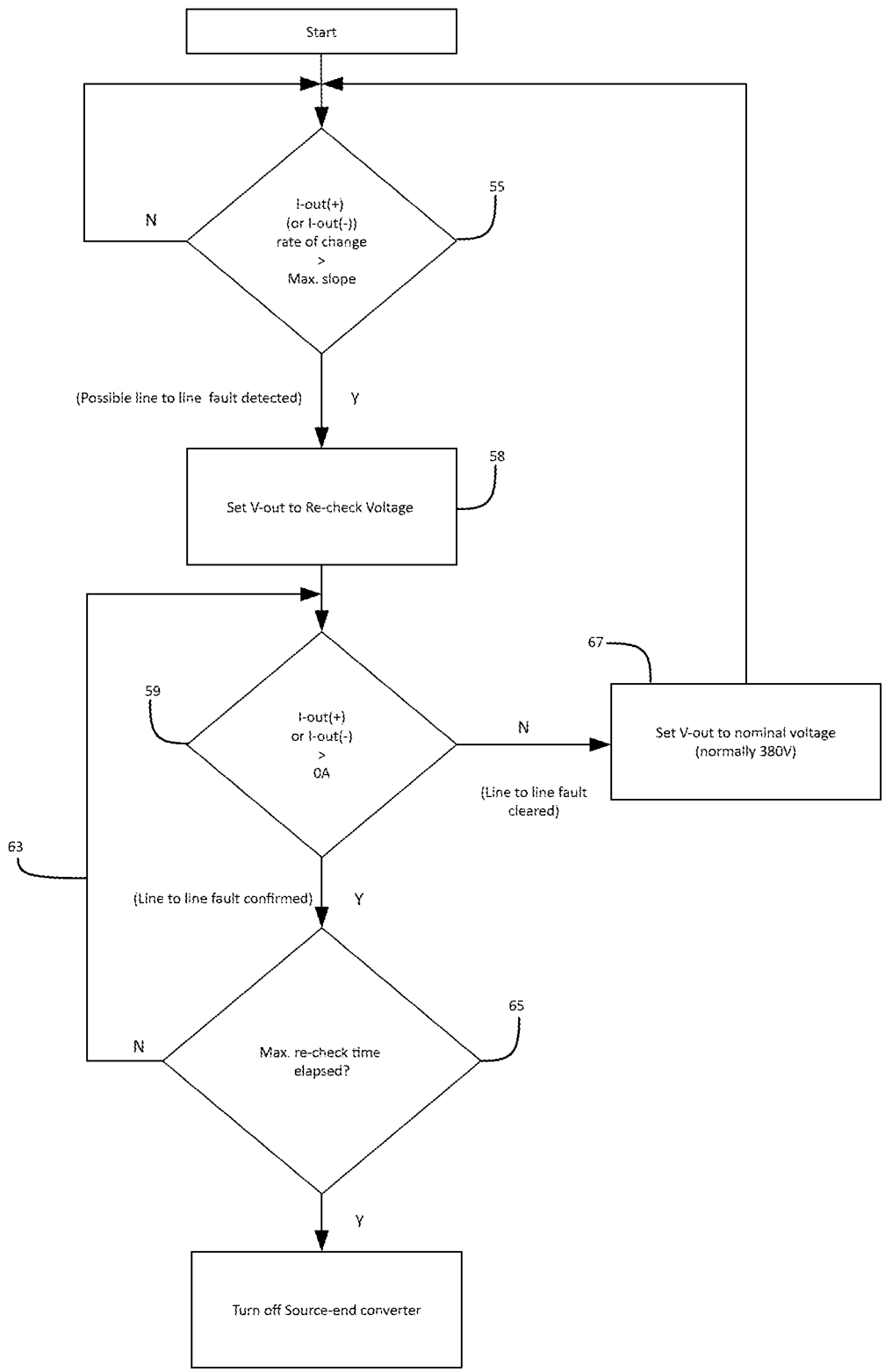
FIG. 5B is a control flowchart for the power supply for the specific embodiment wherein the feature extracted from the transmission line is the rate of change of current; and, FIG. 6 is a block diagram illustrating the point to point supply architecture in which the invention is implemented.

FIG. 5B is a flowchart for the control of the preferred embodiment wherein the feature extracted 55 from the transmission line is specifically a rate of change of current exceeding the rate of change allowed by the load end power conditioning system. If the rate of change is exceeded, a possible line to line fault is recognized and the verification protocol otherwise described in relation to FIG. 5A is engaged.

Ground faults may also be monitored by the controller 114. The current through the mid-point earth/ground connection 120 is assessed. If the current I-earth 122 is greater than a predetermined threshold, then a ground fault is recognized. Other means of detecting grounds faults may also be used, such as detecting a difference threshold between the voltages of each of the two transmission line conductors with respect to ground.

While the preferred embodiment describes the external source of power as 380V DC, the invention is not limited to that embodiment. The source of power may be DC, single or multiple phase AC, three phase AC and any range of voltages, and from a variety of different types of sources (e.g. AC mains, solar, etc.). The type of isolation or conversion applied by the power supply system at the source end of the transmission line will be selected accordingly (AC/DC, DC/DC or potentially no conversion).

The transmission line voltage has been illustrated as a high impedance bipolar center tapped line but the invention is not limited to that embodiment. The transmission line may be floating or positively or negatively ground-referenced.

The detection of a rate of change of current in excess of a predetermined threshold is preferably performed by a separate microcontroller 114 as illustrated in the preferred embodiment. Such embodiment allows a modular architecture for the rate of change control according to the invention and the modular/retrofit application of the invention. According to a modular approach, an existing power distribution system may be installed or retrofitted with rate of change controllers at the source and load ends of the system. The source end module senses the line currents and outputs control variables to the existing converter microcontroller (108), while the load end module senses the condition of the energy storage unit and the line current and outputs control variables to the existing converter microcontroller. However the detection and control functions could be integrated into the converter microcontrollers, in an FPGA, FPAA, ASIC, etc. or even conceivably be embodied directly into the converter circuitry itself.

According to the preferred embodiment, a boost converter at the load end is used to increase the voltage compared to that available from the transmission line in order to maintain high energy in the energy storage unit. However, the transmission line voltage could be sufficiently high that the load end converter would instead apply a reduction of voltage presented to the energy storage unit. It is still contemplated that a set target point of voltage across the energy storage unit would be used to predictably accommodate load transients.

In the foregoing description, exemplary modes for carrying out the invention in terms of examples have been described. However, the scope of the claims should not be limited by those examples, but should be given the broadest interpretation consistent with the description as a whole. The specification and drawings are, accordingly, to be regarded in an illustrative rather than a restrictive sense.

The invention claimed is:

1. A system for providing DC power to a remote load over a transmission line comprising:
   a source power supply supplying DC power to the transmission line;
   a power conditioning system for receiving power from the transmission line and supplying power to the load, said power conditioning system limiting a rate of change of current drawn from the transmission line to a maximum rate of change; and,
   said source power supply configured to reduce its supply of power to the transmission line upon detecting that a rate of change of current drawn by the transmission line is in excess of said maximum rate of change.

2. A system for providing DC power to a remote load over a transmission line comprising:
   a source power supply supplying DC power to the transmission line;
   a load end control system at a load end of the transmission line for limiting a dynamic behavior of the load as seen by the transmission line to be within dynamic behavior parameters that have been predetermined by said load end control system; and,
   a source end control system for reducing the supply of power from said source power supply to the transmission line upon detecting that a dynamic behavior of the transmission line is outside said parameters that have been predetermined by said load end control system.

3. The system of claim 2 wherein said dynamic behavior is a rate of change of current and said dynamic behavior parameters are a maximum rate of change of current, wherein said load end control system limits a rate of change of current drawn from the transmission line to a maximum rate of change determined by said load end control system and said source end control system reduces the supply of power from said source power supply to the transmission line upon detecting that a rate of change of current on said transmission line exceeds said maximum rate of change.

4. The system of claim 3 wherein said load end of the transmission line comprises a power conditioning system for receiving power from the transmission line and delivering it to the load and said load end control system limits a rate of change of current drawn by said power conditioning system from the transmission line.

5. The system of claim 3 further comprising a load end power supply for receiving power from the transmission line and delivering power to the load and wherein said load end control system limits the rate of change of current drawn by the load end power supply from the transmission line.

6. The system of claim 5 further comprising an energy storage unit as a buffer between said load end power supply and said load.

7. The system of claim 6 or of claim 5 wherein said control system controls the output of said load end power supply to target a desired power supplied to said load but wherein said control system limits the rate of change of current drawn by said load end power supply from the transmission line.

* * * * *